United States Patent
Hodges et al.

(10) Patent No.: US 11,696,070 B2
(45) Date of Patent: *Jul. 4, 2023

(54) PROTECTION OF SPEAKER FROM EXCESS EXCURSION

(71) Applicant: Synaptics Incorporated, San Jose, CA (US)

(72) Inventors: Richard Hodges, San Jose, CA (US); Harry Lau, San Jose, CA (US); Michael Townsend, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/504,934

(22) Filed: Oct. 19, 2021

(65) Prior Publication Data

US 2022/0038815 A1   Feb. 3, 2022

Related U.S. Application Data

(63) Continuation of application No. 16/672,251, filed on Nov. 1, 2019, now Pat. No. 11,184,705.

(51) Int. Cl.
*H04R 3/00* (2006.01)
*H04R 29/00* (2006.01)
*H04R 3/04* (2006.01)
*H03F 3/181* (2006.01)
*H03F 3/217* (2006.01)

(52) U.S. Cl.
CPC .............. *H04R 3/007* (2013.01); *H04R 3/04* (2013.01); *H04R 29/001* (2013.01); *H03F 3/181* (2013.01); *H03F 3/217* (2013.01); *H03F 2200/03* (2013.01)

(58) Field of Classification Search
CPC .......... H04R 3/007; H04R 3/002; H04R 3/04; H04R 29/001
USPC ....................................... 381/55, 58–59, 120
See application file for complete search history.

(56) References Cited

U.S. PATENT DOCUMENTS

| | | | |
|---|---|---|---|
| 8,983,092 B2 | 3/2015 | Thormundsson et al. | |
| 9,066,171 B2 | 6/2015 | Rauhala et al. | |
| 9,161,126 B2 | 10/2015 | Su et al. | |
| 9,258,659 B2 | 2/2016 | Pan et al. | |
| 9,510,101 B1* | 11/2016 | Polleros | H04R 3/007 |
| 9,654,866 B2 | 5/2017 | Kannan et al. | |
| 9,729,986 B2 | 8/2017 | Crawley et al. | |
| 9,837,971 B2 | 12/2017 | Luo et al. | |
| 9,900,690 B2 | 2/2018 | Risberg et al. | |
| 10,341,767 B2* | 7/2019 | Lawrence | H04R 3/007 |
| 10,827,265 B2* | 11/2020 | Hatab | H04R 3/04 |

(Continued)

FOREIGN PATENT DOCUMENTS

KR   10-2015-0032142   3/2015

*Primary Examiner* — Disler Paul
(74) *Attorney, Agent, or Firm* — Paradice & Li LLP

(57) ABSTRACT

Systems and methods for protecting a loudspeaker from excessive excursion include an audio source, an adaptive excursion protection filter, an audio clipper, an inverse excursion protection filter, an amplifier and a loudspeaker. The system performs operations including receiving an audio signal, applying an excursion protection filter, the excursion protection filter adapting in real-time to one or more speaker conditions, clipping the audio signal, applying an inverse excursion protection filter, and amplifying, using an amplification circuit, the audio signal for output to the speaker.

20 Claims, 3 Drawing Sheets

(56) References Cited

U.S. PATENT DOCUMENTS

| | | | |
|---|---|---|---|
| 10,862,446 B2* | 12/2020 | Ramos | H04R 3/007 |
| 11,183,981 B2* | 11/2021 | Valle | G01R 27/08 |
| 11,399,247 B2* | 7/2022 | French | H04R 3/007 |
| 11,399,767 B2* | 8/2022 | Youm | A61N 1/20 |
| 11,425,476 B2* | 8/2022 | Christoph | H04R 29/003 |
| 2004/0178852 A1 | 9/2004 | Neunaber | |
| 2005/0207584 A1 | 9/2005 | Bright | |
| 2009/0257599 A1 | 10/2009 | Sand Jensen et al. | |
| 2012/0108300 A1 | 5/2012 | Huijser | |
| 2013/0077796 A1 | 3/2013 | Risbo et al. | |
| 2014/0254805 A1 | 9/2014 | Su et al. | |
| 2015/0117675 A1 | 4/2015 | Jennings et al. | |
| 2016/0241960 A1 | 8/2016 | Cheng et al. | |
| 2017/0235543 A1 | 8/2017 | England | |
| 2017/0245079 A1 | 8/2017 | Sheen et al. | |
| 2017/0277607 A1 | 9/2017 | Samii et al. | |
| 2017/0318390 A1 | 11/2017 | Bjork et al. | |
| 2017/0325024 A1 | 11/2017 | Hu et al. | |
| 2018/0103313 A1 | 4/2018 | Doy | |
| 2018/0152785 A1 | 5/2018 | Yeoh et al. | |
| 2019/0028805 A1 | 1/2019 | Goto | |
| 2019/0182589 A1* | 6/2019 | Palit | H03F 3/187 |

* cited by examiner

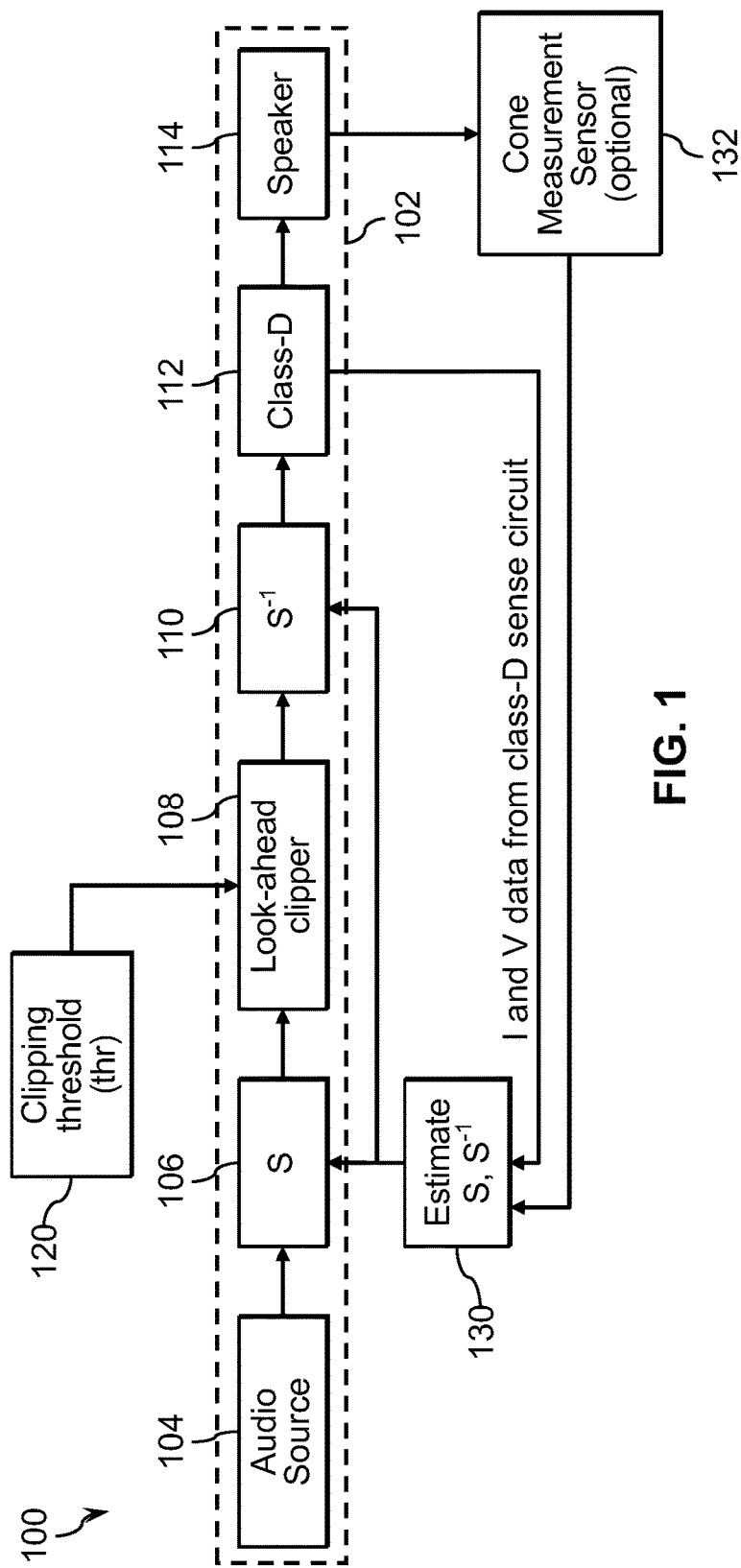
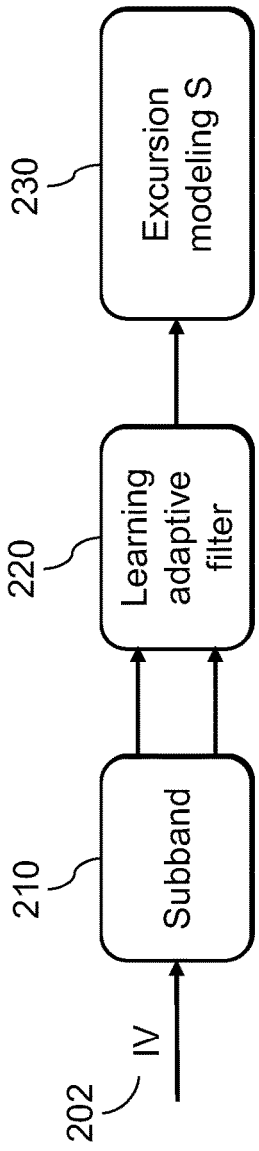
FIG. 1
FIG. 2

PROTECTION OF SPEAKER FROM EXCESS EXCURSION

CROSS-REFERENCE TO RELATED APPLICATIONS

This application is a continuation of U.S. application Ser. No. 16/672,251, entitled "PROTECTION OF SPEAKER FROM EXCESS EXCURSION," filed Nov. 1, 2019, which is hereby incorporated by reference in its entirety.

TECHNICAL FIELD

Various embodiments of the present disclosure relate generally to the reduction of speaker distortion and/or the protection of loudspeakers during operation. More particularly, for example, the present disclosure relates to systems and methods for protecting loudspeakers from excess excursion.

BACKGROUND

Modern consumer electronic devices, such as mobile phones and tablet computers, are typically designed to meet various small form factor, low power and low-cost goals. The components used in these devices, including loudspeakers, may be low-cost components designed to fit into small spaces. A drawback of these smaller loudspeakers is a reduced acoustic output that can be delivered from the device to the user. To satisfy a user's desire for more loudness or volume delivered through the loudspeaker, the loudspeaker may be driven close to its mechanical limits, which can potentially lead to catastrophic loudspeaker failures if the limits are exceeded. In view of the foregoing, there is a continued need for systems and methods that improve acoustic performance of loudspeaker(s) in consumer electronic devices while protecting the loudspeaker(s) from damage.

SUMMARY

Systems and methods are disclosed herein for protecting a loudspeaker and/or reducing distortion due to excess excursion. In various embodiments, systems and methods for protecting a loudspeaker from excessive excursion include an audio source, an adaptive excursion protection filter, an audio clipper, an inverse excursion protection filter, an amplifier and a loudspeaker. The system performs operations including receiving an audio signal, applying an excursion protection filter, the excursion protection filter adapting in real-time to one or more speaker conditions, clipping the audio signal, applying an inverse excursion protection filter, and amplifying, using an amplification circuit, the audio signal for output to the speaker.

In some embodiments, the system includes a logic device further configured to perform operations comprising estimating filter coefficients for the excursion protection filter and the inverse excursion protection filter based at least in part on the amplified audio signal. The operation of estimating the filter coefficients may further comprise receiving current and voltage data from the amplifier. The system may further include a cone measurement sensor configured to measure speaker excursion of the output audio signal, wherein the one or more speaker conditions comprises a speaker excursion measurement. The logic device may be further configured to perform operations comprising estimating a threshold value and applying the threshold value when clipping the audio signal.

In some embodiments, the operation of estimating the excursion filter further comprises estimating a complex impedance of the speaker and estimating a direct current resistance. The operation of estimating the excursion filter may further comprise computing a motion sensitivity function representing motion of the cone as a function of applied voltage and estimating two or more peaks of the computed motion sensitivity function. The operation of estimating the excursion filter may further comprise imposing a slew-rate limit on the peak frequencies and amplitudes and creating a model infinite impulse response filter based at least in part on the estimated peaks.

In some embodiments, the logic device is further configured to perform operations comprising testing parameter values for a current frame of the audio signal, the parameter values comprising one or more parameters used in the estimation of the excursion filter and identifying the frame as invalid if a parameter is detected outside a predetermined range. The logic device may be further configured to perform operations comprising tuning the excursion protection filter through a process comprising measuring a scale factor, determining a clipping level threshold value, and verifying the clipping level threshold value.

The scope of the disclosure is defined by the claims, which are incorporated into this section by reference. A more complete understanding of embodiments of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 1 is a flow diagram illustrating real-time speaker protection, in accordance with one or more embodiments.

FIG. 2 is a flow diagram illustrating a model estimation for real-time speaker protection, in accordance with one or more embodiments.

Figure 3:
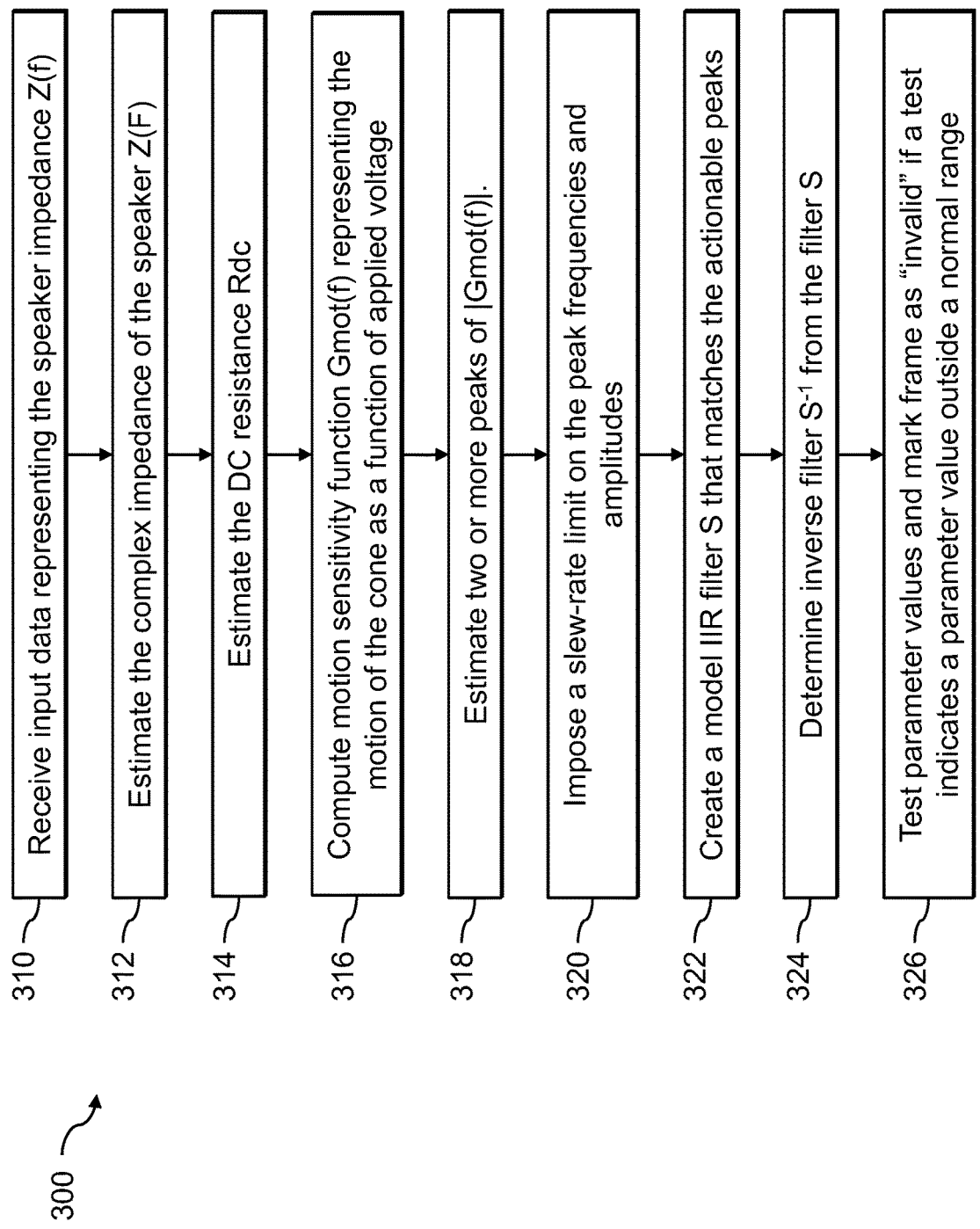
FIG. 3 illustrates a real-time adaptive algorithm for updating the model estimation filter, in accordance with one or more embodiments.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION

The present disclosure provides systems and methods for protecting a loudspeaker from excess excursion during operation. In various embodiments, a louder sound is obtained from a loudspeaker by driving the loudspeaker with higher voltage/power than the standard specification limits for the loudspeaker. Systems and methods are configured to protect the loudspeaker from excessive excursion of the cone of the speaker, which can cause distorted sound and/or damage to the loudspeaker.

An embodiment of the present disclosure will be described with reference to FIG. 1, which illustrates an example real-time algorithm data flow for speaker protection. The algorithm 100 includes a feedforward path 102 that receives audio data from an audio source 104 and processes the audio data for output through a loudspeaker 114. The feed-forward path 102 may operate at a sample rate suitable for high quality audio playback, such as 48 KHz. The other paths (e.g., path 120 to 108; path 112 to 130; 130 to 106; and 130 to 110) in the algorithm 100 are configured to operate at a lower rate, such as a frame rate of 100 Hz. In operation, the excursion of the speaker 114 is limited by the value of the clipping threshold (thr) 120, which is used in the look-ahead clipper 108. The look-ahead clipper 108 is configured to avoid the high frequency distortion that would be created by using a simple instantaneous threshold.

The algorithm 100 creates a model that predicts the cone excursion of the loudspeaker given a drive voltage waveform and uses this model to limit the distortion to a safe value. The algorithm 100 operates in real-time to apply this limiting operation and optionally dynamically updates parameters of the model based on the real-time current and voltage applied to the speaker. An offline tuning algorithm measures the behavior of the loudspeaker 114 and generates an appropriate initial model and other parameters for the real-time algorithm 100.

The approximate model is configured to operate in real time to predict the excursion of the loudspeaker 114 from the applied voltage waveform. The approximate model may be implemented as an infinite impulse response (IIR) filter S 106 specified by SOS coefficients (e.g., coefficients in second-order sections of IIR filter). The filter S applied in block 106 has a stable inverse filter $S^{-1}$, which is applied in block 110. The loudspeaker excursion is limited to a safe value by applying the approximate model filter 106 (e.g., IIR filter S) followed by a look-ahead clipper 108 or other limiter followed by the inverse filter 110 (e.g., inverse filter $S^{-1}$). The excursion model S is continually updated in real-time to adapt to changes in properties of the loudspeaker due to factors such as aging and temperature.

An initial excursion model 130 is estimated for the loudspeaker 114. For example, for a given loudspeaker the initial excursion model 130 is estimated based on a method combining electro-mechanical loudspeaker theory and heuristics enabling an approximate model to be calculated with low computational power. This procedure may use the current (I) and voltage (V) data from the amplifier 112 (e.g., a class-D amplifier) that drives the loudspeaker 114 and may optionally use a sensor 132 for measuring instantaneous cone excursion, e.g., such as with a laser displacement measuring device.

In contrast to conventional algorithms, the algorithm 100 is configured to track more than one peak in the excursion frequency response. Most mini-speakers have more than one peak, for example, because of the common use of ports, passive radiators, or multi-motors to add low-frequency response.

Referring to FIG. 2, an embodiment for estimating the model will now be described. In the illustrated embodiment, the model S is estimated in 230 based on the time-domain current I and voltage V (e.g., IV 202) at the speaker terminal. This data can be obtained, for example, through circuitry integrated with the class-D amplifier 112 of FIG. 1. The input data IV is provided to a subband analysis block 210, which is configured to convert the time domain input signals to frequency domain subbands, for example, by a short-term Fourier transform. An adaptive filter 220 is configured to estimate the speaker complex impedance Z(f) in the frequency domain. In various embodiments, the absolute value of the speaker impedance |Z(f)| will show a prominent peak at the mechanical resonant peak of the loudspeaker cone and its elastic constraints (e.g., a combination of the effect of the spider, surround, and air reaction). This is due to the back electric and magnetic fields (EMF) induced by the motion of the speaker/voice coil in its magnetic field. When the motion velocity is higher, such as at resonance, the back EMF opposes the drive voltage and the resulting smaller effective drive voltage applied to the DC resistance of the coil results in less current.

The voltage in the frequency domain, V(f), is related to the current, I(f), velocity of speaker coil and cone, velocity (f), DC resistance of the voice coil, Rdc, and a force constant, BL, which is the product of the (average) magnetic field B and the length L of the voice coil winding, as follows:

$$V(f)=Rdc*I(f)+\text{velocity}(f)*Bl$$

Referring to FIG. 3, embodiments of a real-time adaptive algorithm for updating the filter S will now be described. The algorithm 300 receives input data representing the speaker impedance, such as frames of Z(f) data, in step 310. In some embodiments, the frames may occur, for example, at 8 millisecond intervals, thus representing many samples of actual audio time-domain data.

In step 312, the algorithm estimates the complex impedance of the speaker Z(F) using a least mean squares (LMS) or other algorithm to obtain the complex impedance Z(f) such that norm(V(f)−Z(f)*I(f)) is minimized. The norm function can be the squared magnitude summed over frequency.

In step 314, the algorithm estimates the DC resistance Rdc as the minimum of abs(Z(f)). Due to phase cancellation, the function abs(Z(f)) can have values that are less than the true value of Rdc. In various embodiments, a histogram of values of abs(Z(f)) is computed and a value is chosen from this histogram representing a low percentile value of abs(Z(f)). For example, a 10-percentile value may be used, which is the value that is lower than 90% of the values of abs(Z(f)) over all relevant frequencies.

In step 316, the algorithm computes an effective motion sensitivity function Gmot(f) that represents the motion of the cone as a function of applied voltage: Gmot(f)=(1−Rdc/Z(f))/f. In the illustrated embodiment, the algorithm divides by f because motion is the integral of velocity over time, and the duration of each cycle of the signal components at f is inversely proportional to f. Thus, motion tends to be larger at lower frequencies.

In step 318, the algorithm estimates two (or more) peaks of |Gmot(f)| In some embodiments, the algorithm picks peaks in the coarse grid of frequencies fused in the frequency-domain representation and then refines the estimate of peak frequency and amplitude by quadratic interpolation of values of |Gmot(f)|. For many loudspeakers such as the mini-speakers used in PC's, phones, and smart devices, the algorithm will pick two peaks: (i) a peak corresponding to the resonant frequency of the speaker; and (ii) a lower frequency peak that is the combined result of the 1/f factor in Gmot together with a possible low-frequency acoustic resonance produced by a port in the speaker enclosure.

In step 320, the algorithm imposes a slew-rate limit on the peak frequencies and amplitudes to prevent the filters being created (S and $S^{-1}$) from changing too rapidly, which can result in audible artifacts. In other words, we do not immediately use the observed peaks and amplitudes—we maintain actionable values of peaks and amplitudes which move toward the observed peaks and amplitudes at no more than a certain constant rate.

In step 322, the algorithm creates a model IIR filter S that matches the actionable peaks. The filter may be generated with two (or more) pairs of poles and zeros, using a filter design algorithm, and may be represented by SOS coefficients.

In step 324, the stable inverse $S^{-1}$ filter is determined (e.g., as used in the speaker protection topology of FIG. 1). This inverse is obtained by simply exchanging the numerator and denominator terms in the SOS representation, followed optionally by normalization of the zeroth-numerator coefficient to 1.0.

In step 326, the algorithm verifies the validity of the input data frame by running tests to verify that the various parameters from steps 312-324 are within a normal range. If any of these tests fails, the frame is marked as "invalid" and no modification is made in the actionable values of peaks and amplitudes.

Figure 4:
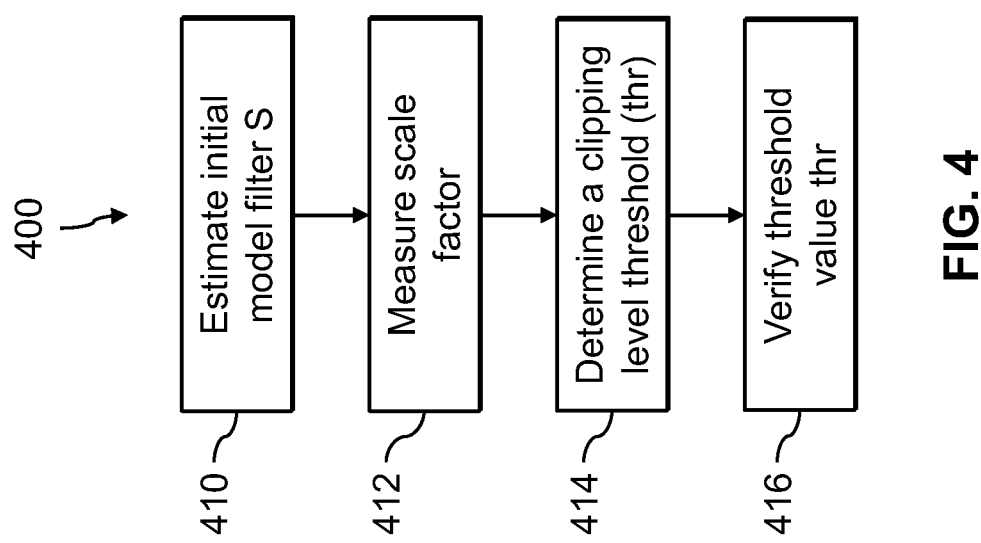
FIG. 4 illustrates an offline tuning algorithm for tuning a model estimation filter, in accordance with one or more embodiments.

Referring to FIG. 4, an offline "tuning" algorithm 400 will now be described in accordance with one or more embodiments. In step 410, the algorithm estimates an initial model filter S. In the illustrated embodiment, a broadband signal at a sample rate of 48 KHz is sent to the speaker. This broadband signal contains energy at a range of frequencies below Nyquist (e.g., all frequencies below Nyquist) and has enough energy to create excursion on the loudspeaker to a sufficient degree to be able to measure the electrical impedance of the loudspeaker voice coil accurately, but not so much energy that significant heating of the voice coil or other damage occurs. In one implementation, the signal includes a series of short bursts of pink noise at approximately −12 dB relative to maximum RMS voltage drive. The instantaneous current and voltage may be measured by class-D amplifier with voltage/current sense circuitry. These time-domain signals are converted to frequency-domain by a suitable short-term Fourier transform in a subband analysis process. In one implementation, for example, the 48 KHz data is down-sampled to 16 KHz and overlapping frames of 32016 KHz samples are converted to 64 complex frequency-domain values current I(f) and voltage V(f). Steps 312 through 322 from FIG. 3 may be performed to estimate an initial filter S.

In step 412, a scale factor is measured. In one implementation, a series of increasing amplitude short sine wave bursts at the frequency of the dominant peak of S are sent to the loudspeaker after passing through the path 102 of FIG. 1, with a nominal constant value of clipping threshold thr 120. The excursion of the loudspeaker 114 is measured by a laser ranging device or other cone measurement sensor 132. The amplitude of the component of the excursion at the frequency of the bursts is calculated by a matched filter technique (for example, the rms value of a Hann-windowed sine convolved with the measured excursion waveform). The excursion amplitude will asymptotically reach a maximum at the nominal threshold thr times the scale factor. The scale factor can then be calculated as the asymptotic maximum divided by the nominal threshold thr. This scale factor is then incorporated in the values of the SOS coefficients representing filter S.

In step 414, a clipping level threshold thr is established for online use. To apply the algorithms disclosed herein in real time, a clipping threshold thr is determine that will provide the highest possible sound level without excessive distortion. To determine thr, a series of sine bursts are sent to the speaker as illustrated in FIG. 1, with a nominal value of thr which is initially set too high (for example a thr of 1.0 mm for a typical mini-speaker for which an actual safe thr is known to be about 0.5 mm.), at a number of frequencies (e.g., from 100 Hz to 8000 Hz in 1/12 octave logarithmic spacing), and increasing amplitudes (e.g., −12 dB FS to 0 dB FS in 3 dB steps). Harmonic distortion of the excursion signal (measured by laser or other sensing component 132) is calculated for each burst. A threshold thr is set such that if the excursion had been limited to that value, the harmonic distortion would not exceed a pre-specified limit, for example 10% (corresponding to 20 dB SDR).

In step 416, the threshold value thr is verified. In one implementation, a series of sine bursts at full scale is sent to the speaker (e.g., via the topology of FIG. 1) with the value of thr calculated in step 414 and scale factor calculated in step 412. The excursion of the speaker is measured by laser or other sensor 132 and plotted as a function of burst frequency. In various embodiments, the excursion is limited at every frequency to a value close to thr.

In some embodiments, it may be desirable to run the real-time algorithm non-adaptively. In this case the filter S, threshold thr, and scale factor can be determined by the tuning algorithm. S is then kept constant for live use. This eliminates the adaptation steps, simplifying the implementation and reducing the computational requirements. The non-adaptive algorithm could be used, for example, to control distortion in a system on a chip implementation for embedded applications.

Figure 5:
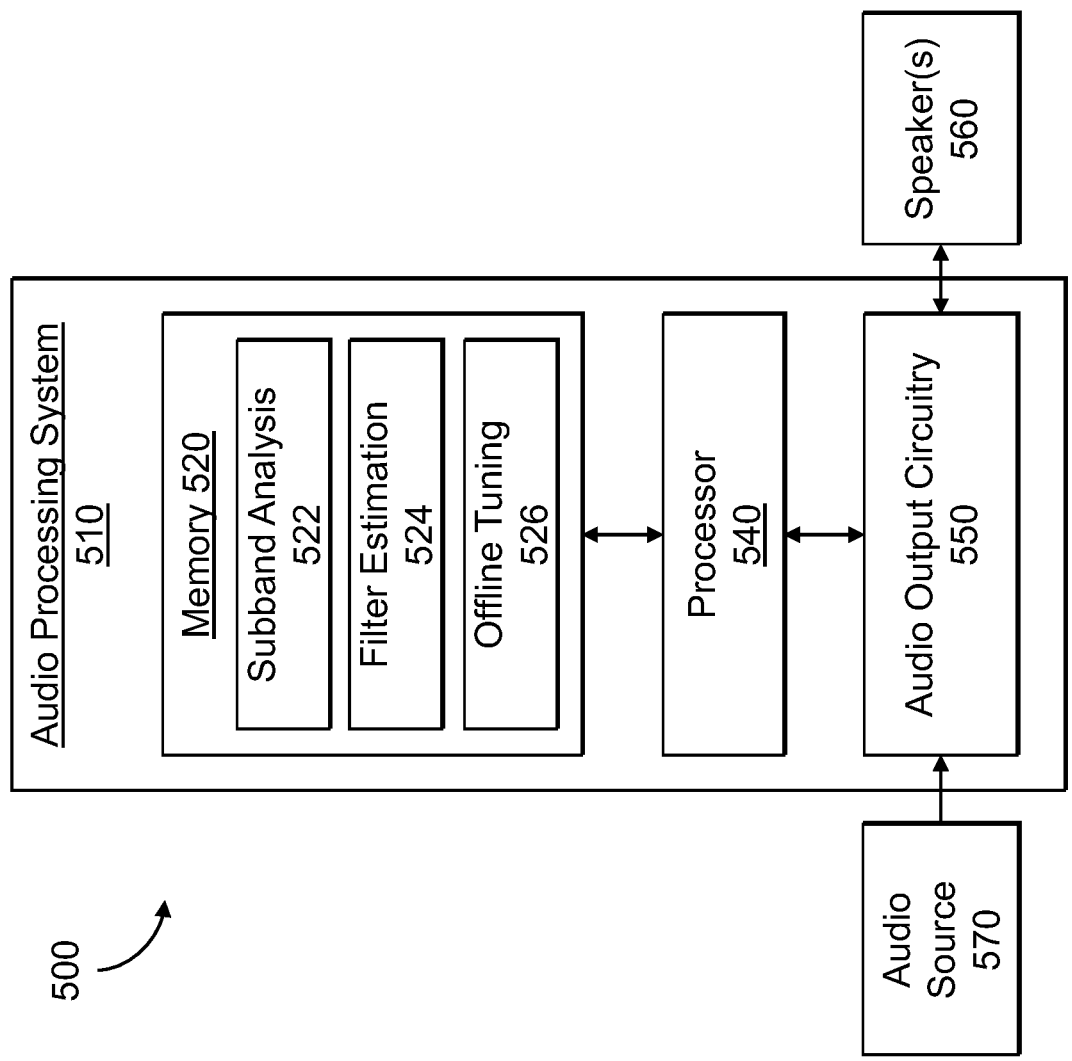
FIG. 5 illustrates an example processing system configured to protect a speaker from excess excursion, in accordance with one or more embodiments.

As discussed, the various techniques provided herein may be implemented by one or more systems which may include, in some embodiments, one or more subsystems and related components thereof. For example, FIG. 5 illustrates a block diagram of an example processing system 500 in accordance with an embodiment of the disclosure. The system 500 may be used to implement any desired combination of the various components, circuits, processing steps, and other operations described herein. Although a variety of components are illustrated in FIG. 5, components may be added and/or omitted for different types of devices as appropriate in various embodiments.

As shown, processing system 500 includes an audio processing system 510 which includes a memory 520, a processor 540, and audio output circuitry 550. Processor 540 may be implemented as one or more logic devices such as a microprocessor, microcontroller, application specific integrated circuit (ASIC), programmable logic device (PLD) (e.g., field programmable gate array (FPGA), complex programmable logic device (CPLD), system on a chip, or other types of programmable devices.

In some embodiments, processor 540 executes machine readable instructions (e.g., software, firmware, or other instructions) stored in memory 520. In this regard, memory 520 may include logic to cause the processor 540 to perform any of the various operations, processes, and techniques described herein. In other embodiments, processor 540 and/or memory 520 may be replaced and/or supplemented with dedicated hardware components to perform any desired combination of the various techniques described herein.

Memory 520 may be implemented as a machine-readable medium storing various machine-readable instructions and data. For example, in some embodiments, memory 520 may store one or more algorithms as machine readable instructions that may be read and executed by processor 540 to perform the various techniques described herein, including a subband analysis algorithm 522, filter estimation algorithm 524, offline tuning algorithm 526, and/or other executable logic. Memory 520 may also store data used by the audio processing system 510. In some embodiments, memory 520 may be implemented as non-volatile memory (e.g., flash memory, hard drive, solid state drive, or other non-transitory machine-readable mediums), volatile memory, or combinations thereof.

The system 500 further includes audio source 570 and one or more speakers 560. In operation the audio source 570 provides audio data for processing by the audio output circuitry and playback by the one or more speakers 560. The system 500 may be used to perform processes disclosed herein to protect the one or more speakers 560 from excess excursion. In some embodiments, each of the one or more speakers 560 has a corresponding excursion protection filter disclosed herein. The system 500 may further include other speaker protection techniques including temperature and power protection of the speakers 560.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and/or hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random-access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Embodiments described herein are examples only. One skilled in the art may recognize various alternative embodiments from those specifically disclosed. Those alternative embodiments are also intended to be within the scope of this disclosure. As such, the embodiments are limited only by the following claims and their equivalents.

What is claimed is:

1. A method performed by an audio processing system, comprising:
receiving an audio signal;
amplifying the audio signal for output via a speaker;
receiving current and voltage data associated with the amplified audio signal;
estimating an impedance of the speaker based on the received current and voltage data;
estimating a direct current resistance (Rdc) of a speaker coil that drives a cone of the speaker based on the estimated impedance;
updating an excursion model representing an excursion of the speaker based at least in part on an algorithm that utilizes a motion of the cone of the speaker as a function of the estimated direct current resistance Rdc; and
dynamically adjusting the amplification of the audio signal based at least in part on the updated excursion model.

2. The method of claim 1, wherein the updating of the excursion model comprises:
measuring the excursion of the speaker associated with the output audio signal; and
adapting the excursion model to the measured excursion of the speaker.

3. The method of claim 1, wherein the updating of the excursion model comprises:
estimating filter coefficients associated with an infinite impulse response (IIR) filter based at least in part on the motion of the cone as a function of the estimated direct current resistance Rdc.

4. The method of claim 3, wherein the dynamic adjusting of the amplification of the audio signal comprises:
applying the IIR filter to the audio signal;
clipping an output of the IIR filter based on a clipping threshold; and
applying an inverse filter to the clipped output of the IIR filter, the inverse filter representing an inverse of the IIR filter.

5. The method of claim 3, wherein the estimating of the filter coefficients comprises:
converting the current and voltage data to frequency domain subbands I(f) and V(f), respectively, the impedance of the speaker (Z(f)) being estimated based on I(f) and V(f).

6. The method of claim 5, wherein the estimating of the filter coefficients further comprises:
computing a motion sensitivity function (Gmot(f)) representing the motion of the cone of the speaker as a function of frequency (f), where:

$$Gmot(f) = \left(1 - \frac{Rdc}{Z(f)}\right)\frac{1}{f}.$$

7. The method of claim 6, wherein the estimating of the filter coefficients further comprises:
estimating two or more peaks of |Gmot(f)|; and
creating a model of the IIR filter based on the estimated peaks of |Gmot(f)|.

8. The method of claim 7, wherein the estimating of the two or more peaks of |Gmot(f)| comprises:
imposing a slew-rate limit on peak frequencies and amplitudes associated with Gmot(f).

9. The method of claim 3, further comprising:
tuning the IIR filter based on a scale factor and a clipping level threshold associated with the excursion of the speaker.

10. An audio processing system comprising:
an amplifier configured to receive and amplify an audio signal for output via a speaker; and
a speaker protection system configured to protect the speaker from excess excursion by:
 receiving current and voltage data associated with the amplified audio signal;
 estimating an impedance of the speaker based on the received current and voltage data;
 estimating a direct current resistance (Rdc) of a speaker coil that drives a cone of the speaker based on the estimated impedance;
 updating an excursion model representing an excursion of the speaker based at least in part on an algorithm that utilizes a motion of the cone of the speaker as a function of the estimated direct current resistance Rdc; and
 dynamically adjusting the amplification of the audio signal based at least in part on the updated excursion model.

11. The audio amplification system of claim 10, wherein the speaker protection system is to update the excursion model by:
 measuring the excursion of the speaker associated with the output audio signal; and
 adapting the excursion model to the measured excursion of the speaker.

12. The audio amplification system of claim 10, wherein the speaker protection system is to update the excursion model by:
 estimating filter coefficients associated with an infinite impulse response (IIR) filter based at least in part on the motion of the cone as a function of the estimated direct current resistance Rdc.

13. The audio amplification system of claim 12, wherein the speaker protection system is to dynamically adjust the amplification of the audio signal by:
 applying the IIR filter to the audio signal;
 clipping an output of the IIR filter based on a clipping threshold; and
 applying an inverse filter to the clipped output of the IIR filter, the inverse filter representing an inverse of the IIR filter.

14. The audio amplification system of claim 12, wherein the speaker protection system is to estimate the filter coefficients by:
 converting the current and voltage data to frequency domain subbands I(f) and V(f), respectively, the impedance of the speaker (Z(f)) being estimated based on I(f) and V(f).

15. The audio amplification system of claim 14, wherein the speaker protection system is to estimate the filter coefficients further by:
 computing a motion sensitivity function (Gmot(f)) representing the motion of the cone of the speaker as a function of frequency (f), where:

$$Gmot(f) = \left(1 - \frac{Rdc}{Z(f)}\right)\frac{1}{f}.$$

16. The audio amplification system of claim 15, wherein the speaker protection system is to estimate the filter coefficients by:
 estimating two or more peaks of |Gmot(f)|; and
 creating a model of the IIR filter based on the estimated peaks of |Gmot(f)|.

17. The audio amplification system of claim 16, wherein the speaker protection system is to estimate the two or more peaks of |Gmot(f)| by:
 imposing a slew-rate limit on peak frequencies and amplitudes associated with Gmot(f).

18. The audio amplification system of claim 12, wherein the speaker protection system is further configured to:
 tune the IIR filter based on a scale factor and a clipping threshold associated with the excursion of the speaker.

19. A speaker protection system comprising:
one or more processors; and
a memory storing instruction that, when executed by the one or more processors, causes the speaker protection system to:
 receive an audio signal;
 receive current and voltage data associated with an amplification of the audio signal for output via a speaker;
 estimate an impedance of the speaker based on the received current and voltage data;
 estimate a direct current resistance (Rdc) of a speaker coil that drives a cone of the speaker based on the estimated impedance;
 update an excursion model representing an excursion of the speaker based at least in part on an algorithm that utilizes a motion of the cone of the speaker as a function of the estimated direct current resistance Rdc; and
 dynamically adjust the amplification of the audio signal based at least in part on the updated excursion model.

20. The speaker protection system of claim 19, wherein the dynamic adjusting of the amplification of the audio signal comprises:
 estimating filter coefficients associated with an infinite impulse response (IIR) filter based at least in part on the received current and voltage data;
 applying the IIR filter to the audio signal;
 clipping an output of the IIR filter based on a clipping threshold; and
 applying an inverse filter to the clipped output of the IIR filter, the inverse filter representing an inverse of the IIR filter.

\* \* \* \* \*